United States Patent [19]

Sandfort

[11] 4,104,422
[45] Aug. 1, 1978

[54] METHOD OF FABRICATING MAGNETIC BUBBLE CIRCUITS

[75] Inventor: Robert Melvin Sandfort, St. Charles, Mo.

[73] Assignee: Monsanto Company, St. Louis, Mo.

[21] Appl. No.: 582,787

[22] Filed: Jun. 2, 1975

Related U.S. Application Data

[62] Division of Ser. No. 455,219, Mar. 27, 1974, Pat. No. 3,921,157.

[51] Int. Cl.$^2$ .............................................. B05D 5/12
[52] U.S. Cl. .................................... 427/123; 427/130; 427/131; 427/132; 427/264; 427/265; 427/271
[58] Field of Search ............... 427/123, 125, 130, 131, 427/132, 264, 265, 271, 47, 48; 156/3, 18, 652, 656; 340/174 TF, 174 BA

[56] References Cited

U.S. PATENT DOCUMENTS

| 3,677,843 | 7/1972 | Reiss ................................... 427/130 |
| 3,723,716 | 3/1973 | Bobeck et al. ................. 340/174 TF |
| 3,919,055 | 11/1975 | Urban .................................. 427/131 |
| 3,932,688 | 1/1976 | Sugita ................................. 427/132 |
| 3,967,002 | 6/1976 | Almasi et al. ....................... 427/132 |
| 4,013,803 | 3/1977 | Josephs ............................... 427/125 |

Primary Examiner—Cameron K. Weiffenbach
Attorney, Agent, or Firm—Lane, Aitken, Dunner & Ziems

[57] ABSTRACT

In a bubble chip, increased spacing between a circuit overlay and a sheet of magnetic bubble material is provided at selected locations for particular circuit elements from which bubbles are to be deflected by magnetic repulsion. Differential spacing is achieved in one embodiment by means of a stratified spacing layer composed of the conventional nonmagnetic spacing layer plus a layer of nonmagnetic metal etched to form a mesa pattern which may include electrical control leads where necessary.

3 Claims, 5 Drawing Figures

METHOD OF FABRICATING MAGNETIC BUBBLE CIRCUITS

This is a division, of application Ser. No. 455,219 filed Mar. 27, 1974, now U.S. Pat. No. 3,921,157.

BACKGROUND OF THE INVENTION

The invention relates generally to the field of magnetic bubble technology (MBT), and more particularly to the structure and fabrication of bubble devices, especially those in which bubble logic is performed.

MBT involves the creation and manipulation of magnetic bubbles in specially prepared magnetic materials. The word "bubble" used throughout this text, is intended to encompass any single-walled magnetic domain, defined as a domain having an outer boundary which closes on itself. The application of a static uniform magnetic bias field orthogonal to a sheet of magnetic material having suitable uniaxial anisotropy causes the normally random serpentine pattern of magnetic domains to shrink into isolated, short cylindrical configurations or bubbles whose common polarity is opposite that of the bias field. The bubbles repel each other and can be moved or "propagated" by a magnetic field in the plane of the sheet.

Many schemes exist for propagating bubbles along predetermined channels at a precisely determined rate so that uniform data streams of bubbles are possible in which the presence or absence of a bubble at a particular position within the stream indicates a binary "1" or "0". MBT was originally envisioned in the form of a mass memory, but some of the most difficult problems have been encountered in the basic memory function of readout. It is possible, however, to minimize readout to a great extent by incorporating logic in the memory so that the magnetic bubbles representing information can be logically manipulated before readout is necessary to increase the quality or informational content of each bit of readout. The use of bubbles themselves as logic variables for performing logic operations is based on the fact that close magnetic bubbles tend to repel each other. Thus, if alternate paths with varying degrees of preference are built into a propagation system, the direction which a bubble on one channel ultimately takes may be influenced by the presence or absence of a corresponding bubble on another closely spaced channel.

Conventional bubble devices are prepared in composite monolithic structures referred to as "chips" in analogy to the structure of integrated electrical circuits. In field-accessed propagation systems, a thin overlay pattern of soft ferromagnetic elements is formed on a spacing layer over a sheet of magnetic bubble material. Nonmagnetic electrical conductors are also bonded to the spacing layer for use in bubble generation, transfer, readout and annihilation, for example. The thickness of the spacing layer has critical margins. It is well known that the spacing layer effects the degree of interaction or "coupling" between the bubbles and the overlay circuit. Magnetic bubbles tend to stay under the soft ferromagnetic elements of the circuit overlay because of the energy minimizing effect of containing the magnetic lines of flux emanating from the bubble domain, much like a keeper on the poles of a magnet. If the overlay material is too close to the bubble material, however, spurious bubble generation or "nucleation" can occur. If the spacing is too great, the interaction between the overlay and the bubbles may not be significant enough to be useful. The aim is thus to have the overlay close enough to the bubble material to guide the bubbles without adversely affecting them. There are optimal spacings for different kinds of circuit elements as well as for different materials, thickness, widths and other parameters.

Generally speaking, the degree of coupling in a circuit designed only for storage or memory should be high since the basic characteristic of field-accessed bubble memory is orderly propagation, and a high magnetic interaction between the overlay and the bubbles serves to keep the bubble from straying from the propagating track. On the other hand, in circuits designed to perform logic by means of bubble-to-bubble repulsion, there are occasions when it is desirable to deflect one bubble onto an adjacent track, and in this case the deflected bubble should be less strongly attracted or coupled to its original circuit element while the deflecting bubble should be strongly coupled to its circuit element.

SUMMARY OF THE INVENTION

The general object of the invention is to provide an efficient technique for fabricating bubble chips which permits a variation in the thickness of the spacing layer to accommodate different degrees of coupling between bubbles and the overlay circuit to facilitate logic operations without degrading the integrity of normal propagation or storage operations.

According to the invention, a spacing layer between the bubble material and the circuit overlay is designed with a special topography providing raised plateaus or mesas at selected locations where it is desired to weaken the coupling between bubbles and a particular overlay element or series of elements. The nonuniform thickness of the spacing layer facilitates logic operations by making bubbles more prone to deflection at selected locations of logic interaction while preserving the optimum spacing for orderly propagation in other areas of the same bubble chip.

In one embodiment the nonuniform spacing layer is a composite comprised of adjacent strata or layers of different material. The first layer adjacent to the bubble material is, for example, silicon oxide applied in the conventional manner to a thickness which would permit strong enough coupling with a circuit overlay for normal propagation, i.e., simple shift register operation, or for holding a bubble on a circuit element where that bubble is to perform the function of deflecting another bubble from a different circuit element. A nonmagnetic electrically conductive layer is applied over the first layer to the appropriate thickness to reduce magnetic coupling in order to facilitate deflecting a bubble from a particular overlay element or elements. A pattern is defined and etched in the metal layer to serve as a thickness mesa in those areas where it is desired to reduce coupling to overlay elements. The circuit overlay of soft ferromagnetic material is deposited and etched over the mixed topography of the composite spacing layer such that circuit elements from which bubbles can be deflected are located on the raised mesa portions of the stratified spacing layer; elements carrying out normal propagation or guiding deflector bubbles are located on the lower level at closer spacing to the magnetic bubble material to enhance coupling.

In this embodiment the upper portion of the stratified spacing layer can simultaneously be etched to provide the electrical control leads normally required for functions like transfer generation, readout and annihilation.

The principle of the stratified spacing layer can be applied to many different kinds of logic circuits, and the bubble circuit designer need not compromise in determining the appropriate spacing layer for both deflection and normal propagation. The invention provides a means for achieving equivalent operating margins for both logic and pure memory functions on the same bubble chip.

DESCRIPTION OF THE PREFERRED EMBODIMENTS

Figure 1:
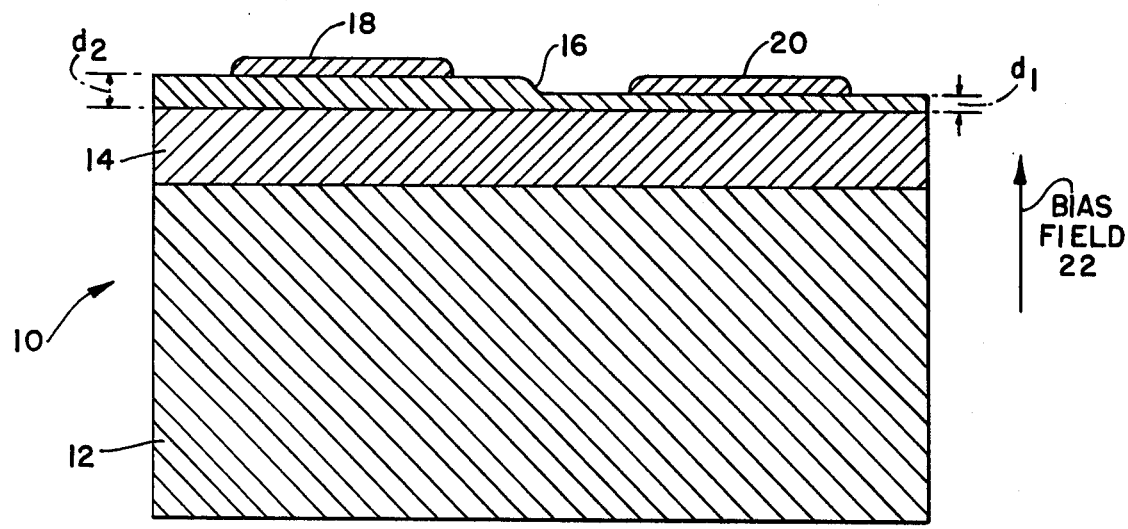
FIG. 1 is a sectional view of a bubble chip having a spacing layer of nonuniform thickness according to the invention.

FIG. 1 illustrates application of the basic principle of a spacing layer of nonuniform thickness to an otherwise conventional bubble chip 10. The chip 10 comprises a substrate 12 of nonmagnetic garnet on which a bubble layer 14 of epitaxially grown magnetic bubble garnet is formed. A nonmagnetic spacing layer 16 of varying thickness is disposed on top of the magnetic bubble layer 14. Ferromagnetic overlay circuit elements 18 and 20 are applied to the spacing layer 16. The phrase "ferromagnetic overlay circuit element" as used herein is defined as meaning an overlay configuration of ferromagnetic material which will function to propagate magnetic bubbles in an adjacent magnetic bubble layer in response to a magnetic drive field. A bias field 22 orthogonal to the bubble layer 14 maintains magnetic bubbles in the layer 14. The bubbles can be propagated by a magnetic drive field directed in the plane of the layer 14. The drive field causes temporary magnetic poles to be formed in the highly permeable elements 18 and 20 to propagate bubbles. The nonuniform thickness of the spacing layer 16 provides a closer spacing ($d_1$) between element 20 and the bubble layer 14 than the spacing ($d_2$) for element 18 and layer 14. As a result the magnetic coupling is weaker for a bubble under the element 18 than for one under the element 20. Thus the element 18 may be used advantageously as a juncture in a propagation path at which bubbles can be deflected to an alternate path under appropriate conditions. On the other hand, the closer spacing of the element 20 facilitates its operation as part of a normal propagating path.

Figure 2:
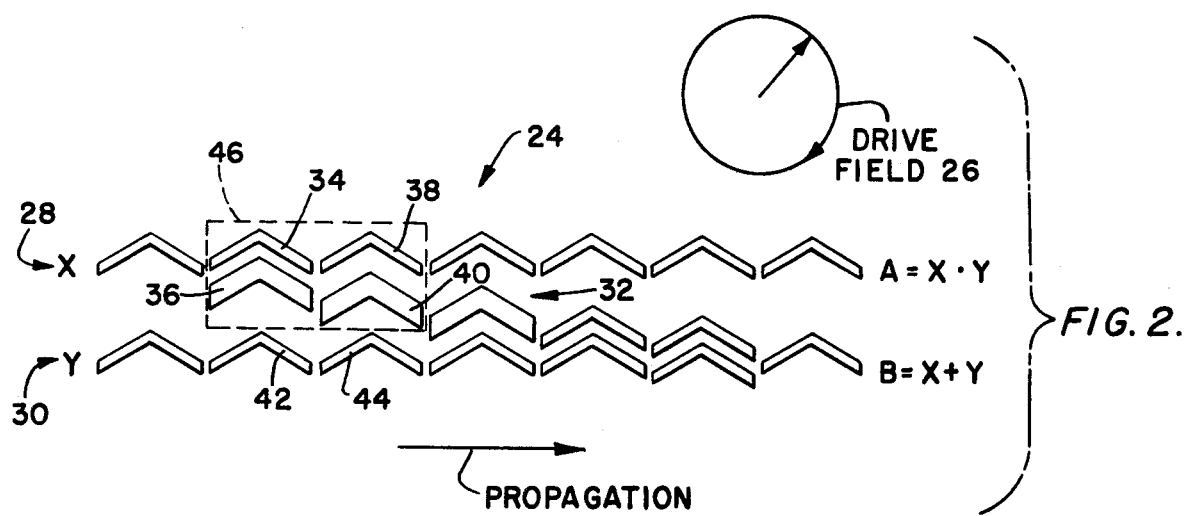
FIG. 2 is a plan view of an overlay circuit pattern for a simple logic circuit, indicating a mesa region in the underlying spacing layer, according to the invention.

FIG. 2 illustrates an application of this principle to a specific chevron logic circuit, an AND/OR gate. Circuit 24 propagates from left to right under the influence of the in-plane clockwise rotating drive field 26. The circuit 24 comprises parallel upper and lower channels 28 and 30. An interchannel transfer path 32 composed of chevrons of increased width causes bubbles representing a variable X to be transferred from the upper channel 28 to the lower channel 30 in the absence of a corresponding bubble, representing a variable Y, on the lower channel 30. If X and Y are simultaneously present (i.e., "1"), bubble-to-bubble repulsion causes the X bubble to remain on the upper channel 28. A Y bubble in all cases enters and exits on the lower channel 30. Thus the output function A of the upper channel is the AND function (X·Y) and the output function B of the lower channel 30 is the OR function (X+Y). The critical juncture between the transfer path 32 and the upper channel 28 is formed by two pairs of chevrons 34, 26 and 38, 40. These chevron pairs correspond to the single chevrons 42 and 44 on the lower channel 30. The simultaneous presence of a Y bubble on the lower channel 30 on chevron 42 will tend to effect an X bubble on the upper channel 28 so that it remains on the upper channel by way of chevrons 34 and 38. To enhance the deflection operation the area encompassing chevrons 34, 36, 38 and 40, that is, the junction between the upper channel 28 and the transfer path 32, is by design arranged on the raised portion of the underlying spacing layer as indicated by the dashed box 46. With reference to FIG. 1 the spacing of the chevrons in the area 46 (FIG. 2) from the bubble layer 14 would be the increased thickness $d_2$. As a result, deflector bubbles on chevrons 42 and 44 in the lower channel 30 are more strongly coupled to the overlay than deflectible bubbles on the upper channel 28 in the vicinity of the junction area 46.

Figure 3:
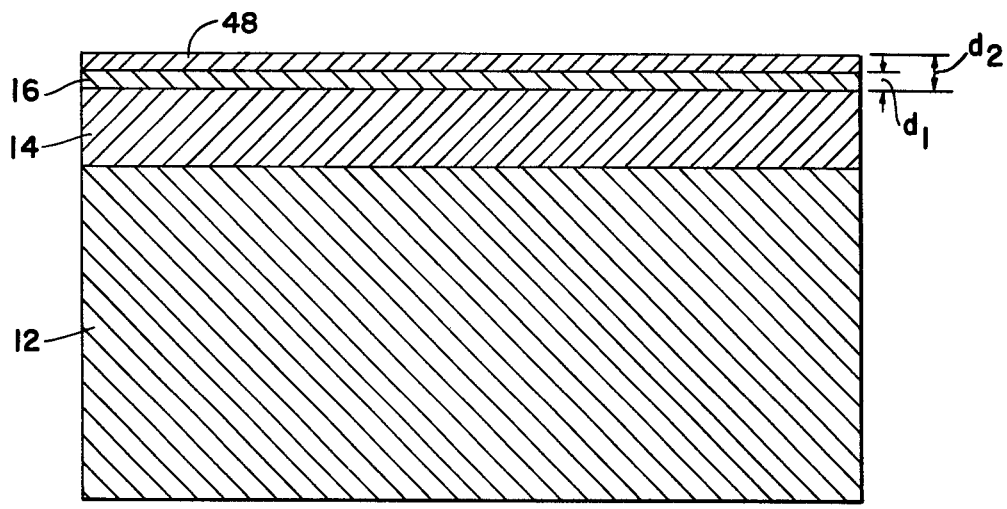
FIGS. 3, 4 and 5 are similar sectional views illustrating successive stages in fabricating a bubble chip having a stratified spacing layer according to the invention.
Figure 4:
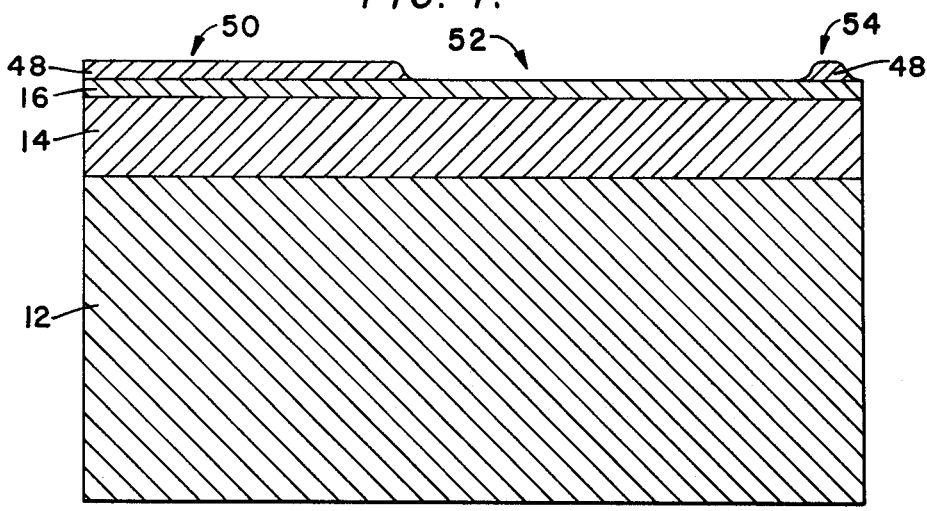
Figure 5:
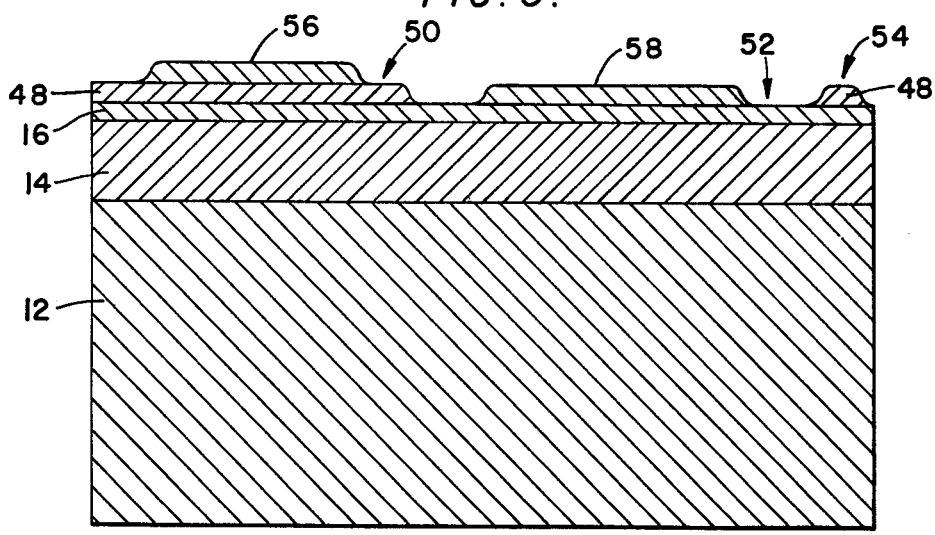

FIGS. 3, 4 and 5 illustrate a specific technique for achieving a nonuniform spacing layer in a bubble chip. The technique will be described in terms of sequential steps or stages of fabrication. First the epitaxial layer 14, usually garnet, is grown on the nonmagnetic substrate 12. Next, a spacing layer 16 of nonmagnetic, electrically nonconductive material (e.g., silicon oxide) is deposited on the surface of the layer 14 to a thickness, greatly exaggerated in FIG. 3, which would provide optimum spacing for normal propagation, or shift register operation, with a given type of overlay circuit element. The spacing layer 16 may be of uniform thickness as in standard practice.

Departing from conventional procedures, a second spacing layer 48 of nonmagnetic, electrically conductive material is deposited over the original spacing layer 16. Layers 16 and 48 together comprise a stratified spacing layer whose overall thickness $d_2$ represents a different optimum spacing for weakly coupling bubbles to an element from which bubbles are to be deflectible, while the thickness of the first spacing layer 16 would be suitable for normal shift register operation.

The next phase of this technique is to define a predetermined pattern on the surface of the second spacing layer 48 and to etch the layer 48 so as to remove whole portions thereof to leave a mesa topography. The word mesa refers, for example, to the raised plateau 50 remaining in FIG. 4 after etching out the adjacent area 52. The mesa topography may include a linear pattern of conductors or control leads, represented by ridge 54 in FIG. 4, for use in transfer, generation annihilation and readout, for example.

The next step in the procedure is to deposit a thin layer of soft ferromagnetic material to form the circuit overlay directly on top of the composite spacing layer formed by the etched layer 48 and the planar layer 16. A pattern of circuit elements is defined and etched in the ferromagnetic overlay by conventional techniques to leave circuit elements 56 and 58 on the exposed surface of the bubble chip as shown in FIG. 5. Circuit elements such as element 56 from which a bubble is to be deflectible, are prearranged to rest on top of the mesa 50, for example, at the greater spacing $d_2$ between the overlay element and the bubble layer 14 in order to weaken the coupling. Circuit elements such as element 58 designed for normal propagation, or for carrying bubbles which will deflect bubbles from an element such as element 56, are arranged to reside "on the plains", directly on the conventional spacing layer 16.

In practice it has been found that a suitable material for the electrically conductive nonmagnetic layer 48 is chromegold alloy. Other nonmagnetic metals like copper and aluminum may also be adapted for use in layer 48.

The basic principle of a spacing layer of nonuniform thickness between the ferromagnetic circuit elements and the bubble layer permits single bubble chips to be fabricated having the same wide operating margins (particularly with reference to bias and drive field strengths and propagation rate) for both logic and pure memory functions. In addition the special technique of fabricating a nonuniform spacing layer in the form of a stratified dual level spacing layer composed of a first planar layer of nonmagnetic nonconductive material and a second etched layer of nonmagnetic conductive material enables the creation of two specifically determined thicknesses to provide a mesa topography which is limited only by the current capabilities of photolithography and chemical etching processes. Moreover since a conductive layer is normally required for patterns of conductors performing special operations such as readout, different areas on the same conductive layer can be used simultaneously to form the second level of the spacing layer and to form electrical control leads on the chip. Both the mesa features and the control lead patterns can easily be provided on the same "mask" so that all of these features are defined and etched at once.

The invention may be embodied in many different forms without departing from its essential principles. For example, the invention appears to be compatible with any kind of overlay element. It is immaterial whether the overlay elements are continuous or discrete. The specific embodiments described above are therefore intended to be purely illustrative and not restrictive, the scope of the invention being indicated by the appended claims and all variations within the range of equivalence are intended to be encompassed therein.

I claim:

1. A method of fabricating a bubble chip, comprising the steps of depositing a first spacing layer of nonferromagnetic material on top of a sheet of magnetic bubble material, then depositing a second spacing layer of a different nonferromagnetic material on top of said first spacing layer, then selectively removing portions of said second spacing layer to leave a mesa topography in which the locations of raised plateaus correspond to the locations of subsequently applied ferromagnetic overlay circuit elements from which bubbles are to be deflectible, then depositing a layer of ferromagnetic material on top of the partially removed second spacing layer, and then selectively removing portions of said layer of ferrogmagnetic material to leave a pattern of ferromagnetic overlay circuit elements, selected ones of the circuit elements of said pattern being left at least partially on the raised plateaus of said second layer, whereby two different degrees of magnetic coupling are achieved for ferromagnetic overlay circuit elements with different functions on the same bubble chip.

2. The method of claim 1, wherein the material forming the second spacing layer is electrically conductive.

3. The method of claim 2, wherein the step of selectively removing portions of said second spacing layer further includes simultaneously defining said mesa topography and a pattern of electrical leads in said second spacing layer and simultaneously removing portions of said second spacing layer according to the defined patterns, whereby the second spacing layers defines at once electrical leads and raised areas for increasing the spacing of selected elements in said pattern of ferromagnetic overlay circuit elements to decrease their magnetic coupling.

* * * * *